United States Patent
Patel et al.

(10) Patent No.: US 7,975,248 B2
(45) Date of Patent: Jul. 5, 2011

(54) STAGED SCENARIO GENERATION

(75) Inventors: Sidhesh Patel, Tirupati (IN); Prakash Bodhak, Maharashtra (IN)

(73) Assignee: LSI Corporation, Milpitas, CA (US)

( * ) Notice: Subject to any disclaimer, the term of this patent is extended or adjusted under 35 U.S.C. 154(b) by 823 days.

(21) Appl. No.: 11/949,187

(22) Filed: Dec. 3, 2007

(65) Prior Publication Data

US 2009/0144679 A1    Jun. 4, 2009

(51) Int. Cl.
*G06F 17/50* (2006.01)
(52) U.S. Cl. ........................ 716/107; 716/106
(58) Field of Classification Search ................... 716/4–6, 716/106–109
See application file for complete search history.

(56) References Cited

U.S. PATENT DOCUMENTS 7,725,848 B2 *  5/2010  Nebel et al. .................. 716/4
7,779,374 B1 *  8/2010  Hamid et al. ................. 716/4

* cited by examiner

*Primary Examiner* — Jack Chiang
*Assistant Examiner* — Binh C Tat
(74) *Attorney, Agent, or Firm* — Luedeka, Neely & Graham, P.C.

(57) ABSTRACT

A method of verifying integrated circuit designs, by constructing a series of atomic generators in a staged, hierarchical order, applying a lowest of the hierarchical generator stages to device level test cases of the verification process, applying a highest of the hierarchical generator stages to system level test cases of the verification process, reusing code written for and used in the lowest hierarchical generator stage in a next higher generator stage, creating a constraint scenario in the highest hierarchical generator stage, and injecting the constraint scenario into a next lower generator stage.

1 Claim, 6 Drawing Sheets

STAGED SCENARIO GENERATION

FIELD

This invention relates to the field of integrated circuits. More particularly, this invention relates to verifying the correctness of integrated circuit designs prior to creating mask sets and producing actual integrated circuits, a process known as "committing to silicon."

BACKGROUND

Complex integrated circuits, such as System-on-Chip designs, include a large number of circuitry blocks. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

It is highly desirable to verify that such designs are complete and accurate, prior to committing the designs to silicon. The reasons for this are substantially obvious, and include items such as not wasting the time and the money required to manufacture tooling and then produce actual integrated circuits, only to discover that there is a flaw in the design that needs to be fixed.

The verification process currently consumes up to about seventy percent of the total development effort in modern, complex integrated circuit designs. Various verification systems are known in the art, such as eRM (Cadence/Specman), RVM (Synopsys/Vera), and VMM (System Verilog). The methods which are used today for stimulus generation are briefly described below.

Direct Signal/Pin Driving: This is the simplest and most straight forward method to drive design pins from the test case. This method is useful when the design has very few input pins and needs to drive very few combinations on it. This method fails when implementing complex design protocols, and is also inefficient when it comes to stimulus controllability, reusability, and simplicity of the test case.

Direct Bus Functional Module Control: In this method, the Bus Functional Module contains tasks and functions to drive the design ports per the protocol. The tasks and functions take the input data, which is used by the module to drive the design ports. The problem with this method is the tasks and functions of the module must be called repeatedly and in a specific order. As the verification scenario gets more complex, the tests therefore also become more complex. Reuse of the test cases in this method is almost nonexistent as one moves from device level verification to system level verification.

Transaction Level Control: In this method, the transaction class contains data, control, or other information that can be decoded by transactors and driven to the design ports as per the protocol. An atomic transaction generator is used to generate and send the transactions to the transactors. The atomic generator usually generates random transactions using only one transaction class, or it can get a transaction object from a test case or other sources to send directly to the transactors without any modification. This approach is commonly used in verification.

Scenario Level Control: In this method, a scenario generator is used along with the transaction level control to generate a sequence of transactions. The scenario generator randomizes an array of atomic transactions. Constraining of the items in the array is done to generate scenarios as needed. This approach has following issues. (1) The number of constraints to be coded and the complexity of method increases as one moves from a lower level to a higher level of test case abstraction. (2) Reusability of the constraints is difficult as one progresses from a lower level to a higher level of test case abstraction. (3) The tool requires more time and resources to resolve the constraints as the complexity and number of the constraints increases.

Verification engineers want to reuse device level test infrastructure at the system level, and generate complex test scenarios. Another desire for verification engineers is to manage reusability, controllability, and scalability of stimulus factors from the device level to the system level. However, the overall complexity of generating test scenarios tends to increase as the verification process progresses from device level to system level.

What is needed, therefore, is a staged scenario generation methodology for system on a chip verification to control, reuse, and scale scenario/transaction generation from device level verification to system level verification.

SUMMARY

The above and other needs are met by a method of verifying integrated circuit designs, by constructing a series of atomic generators in a staged, hierarchical order, applying a lowest of the hierarchical generator stages to device level test cases of the verification process, applying a highest of the hierarchical generator stages to system level test cases of the verification process, reusing code written for and used in the lowest hierarchical generator stage in a next higher generator stage, creating a constraint scenario in the highest hierarchical generator stage, and injecting the constraint scenario into a next lower generator stage.

According to another embodiment of the invention there is described an integrated circuit design verification generator with program elements that reside on a computer readable medium, the program elements enabling the computer to cause the generator to selectively generate a random verification scenario, selectively receive a verification scenario that is injected from a higher stage level generator, decode the verification scenario and generate a sequence of lower level scenarios using a callback mechanism, where for each verification scenario, a callback is added that can decode the verification scenario and generate the sequence of lower level scenarios, and selectively inject the sequence of lower level scenarios into a lower stage level generator. In some embodiments the generator is selectively synchronized at one of a sub-system level and a system level to wait for an interrupt from an external event, check a status of the interrupt, and clear the interrupt after each verification scenario.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

According to an embodiment of the present invention, the stimulus generation process is accomplished in following different stages, as listed in the table below, and then further described in the paragraphs thereafter:

| Stage No. | Abstraction level | Stage |
| --- | --- | --- |
| 1 | Module | Atomic generator |
| 2 | Device | Stage0_scenario generator |
| 3 | Sub-system | Stage1_scenario generator |
| 4 | System | StageN_scenario generator |

(1) Atomic generator: This is the same atomic generator as used in the module level atomic generation, as explained above in the transaction scenario level control. (2) Stage0_scenario generator: This stage of generation is one level higher above the atomic generation. The Stage0_scenario generator randomizes stage0_scn_trans per the constraint on its fields, decodes each scenario type, and generate a list of atomic_trans using the constraints. When the scenario type is random_type, the generator generates a random sequence of atomic_trans. (3) Stage1_scenario generator: This stage of generation is one level higher above stage0_scenario generation. This generates a sequence of stage0_scn_trans per the scenario type. (4) StageN_scenario generator: This is one higher stage of generation above the previous stage (N−1) of generation.

Figure 1:
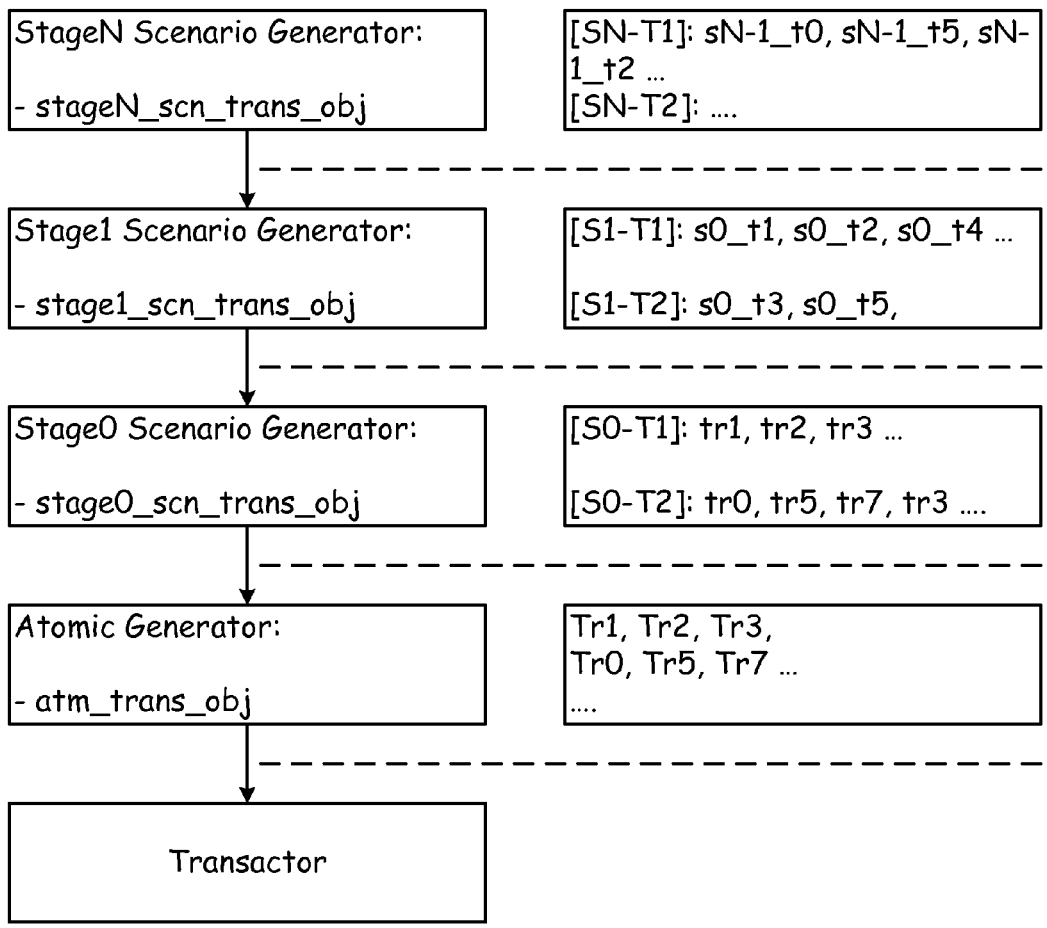
FIG. 1 is a flow chart of the general stages in a staged scenario generation process according to an embodiment of the present invention. This also shows that the generator at each level generates the next lower level transaction sequence, based on the value of the scenario type field in its own transaction.

FIG. 1 depicts graphically the hierarchical stages in this embodiment of the staged scenario generation method. As depicted, each stage in the method has a stage scenario generator. The following steps are executed by the stage scenario generators:

1. Randomization/Injection

The generator can be configured to generate random scenarios, or a higher level generator can inject scenarios into this generator.

2. Decoder

The decoder decodes the scenario type and generates a sequence of lower level scenarios. The decoder is implemented using a callback mechanism. Thus, the decoder becomes scalable. For each scenario type, a callback is added that can decode that scenario type and generate a sequence of lower level scenarios. The default scenario type is random_type. When the scenario type is random_type, the generator generates a sequence of lower level scenarios without any constraint from the generator.

3. Inject to Lower Stage

A generated sequence of scenarios can be injected to a lower stage generator.

Synchronization Operation (Optional)

Figure 2:
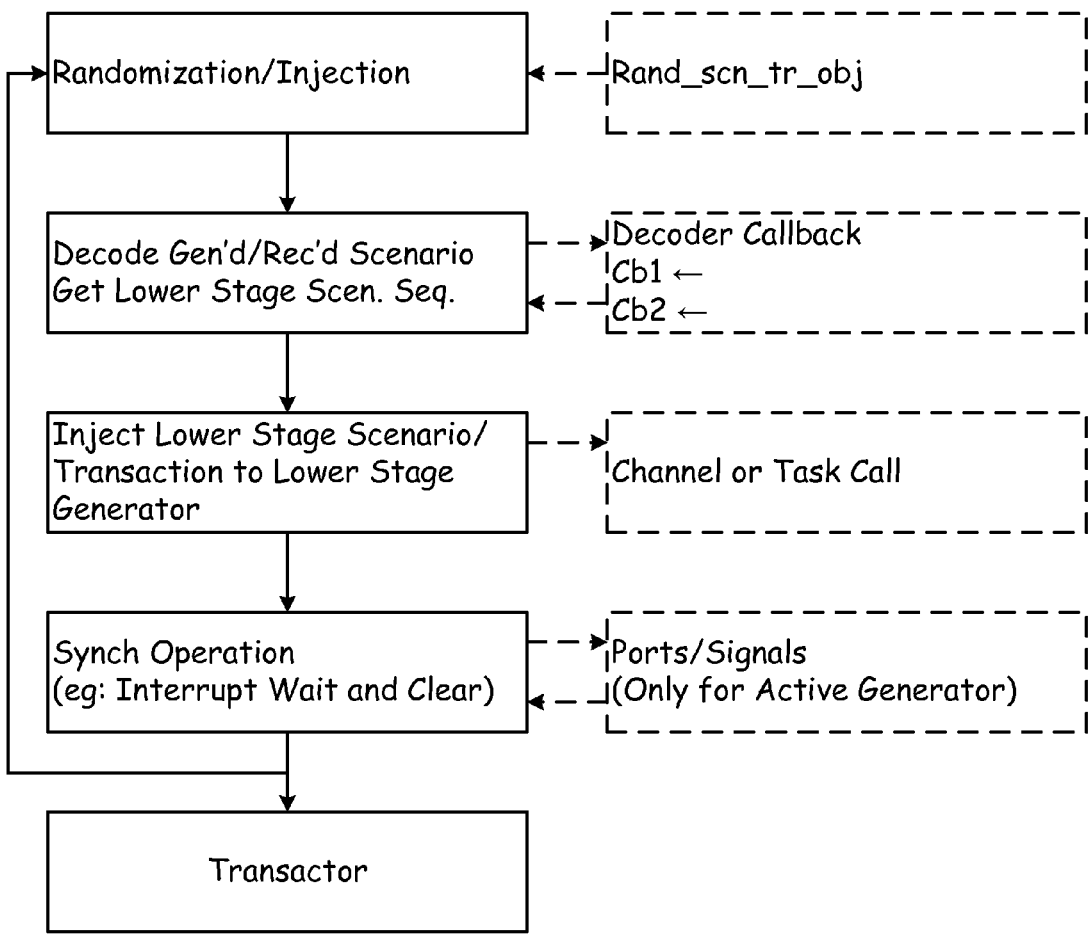
FIG. 2 is a flow chart of the various operations performed by each staged scenario generator in a staged scenario generation process according to an embodiment of the present invention.

Up to this point we have been considering the generator to be a passive component that does not have access to any device under test signals. In certain cases at either the subsystem level or the system level we need to wait for an interrupt, check the status, and then clear the interrupt after each scenario or command. A callback mechanism is implemented in one embodiment, so that the generation can be synchronized with external events. FIG. 2 depicts this synchronized stage scenario generation process.

Figure 3:
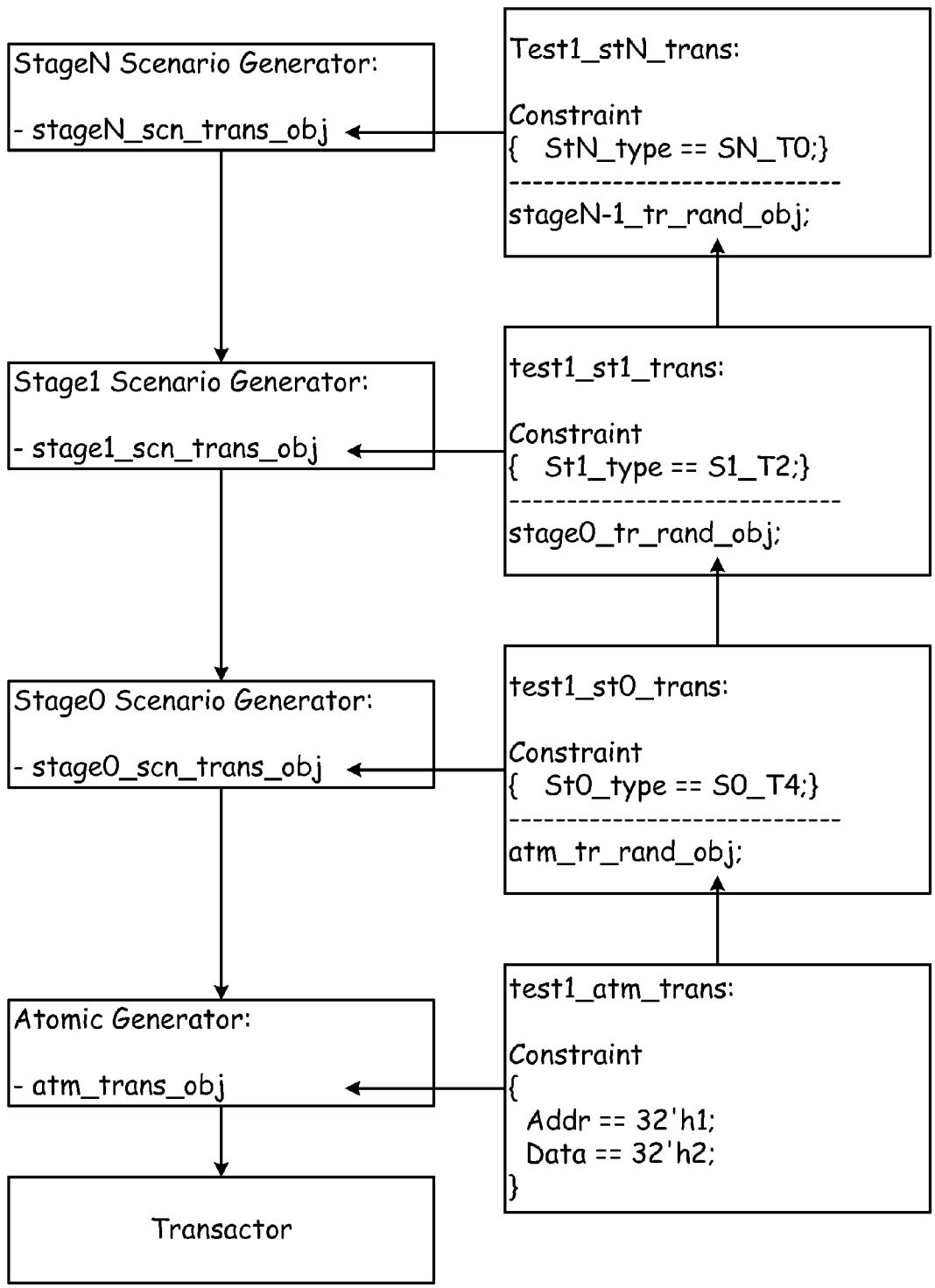
FIG. 3 is a flow chart depicting the controllability at various stages of a staged scenario generation process according to an embodiment of the present invention.
Figures 4A, 4B:
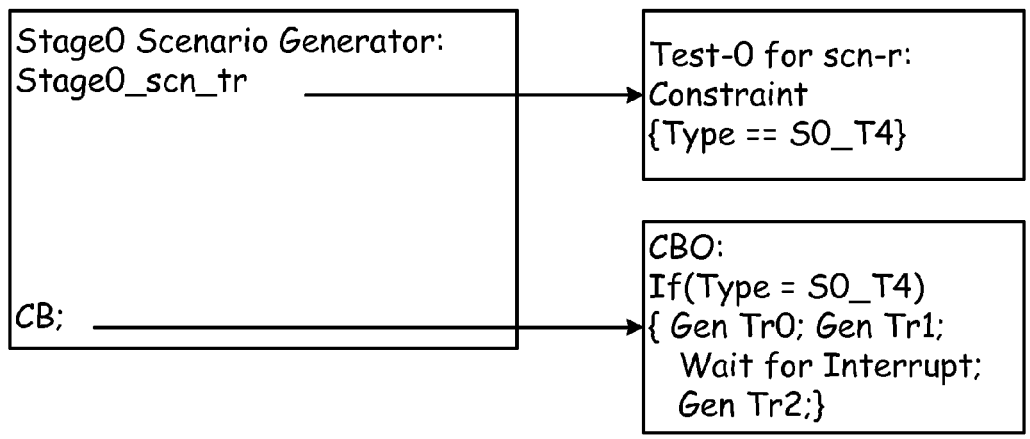
FIG. 4A depicts the pseudo code for a prior art test case. This pseudo code shows how the chain of atomic transactions are sequenced together to complete the test objective. Here, sequencing and controlling is done manually within the test case.
FIG. 4B depicts the pseudo code for a test case according to an embodiment of the present invention. This pseudo code shows the sequence of transactions that are considered as one scenario. This scenario could be added to a generator using a callback method. The scenario generator could have multiple scenarios in it. The scenario within the generator could be selected by writing constraints in a test case.

There are at least three benefits of the stages generation method as described herein, including controllability, scalability, and reusability. This method controls each stage of stimulus generation. For example, suppose a random generation at stage X is desired. Higher stages above stage X can be turned off, while configuring the stage X generator to work in random generation mode. Each stage transaction class has one object of previous stage transaction class that is randomized by a decoder callback. This generates a directed random scenario at a lower level. FIG. 3 depicts the controllability at the various stages of the staged scenario generation method.

In regard to scalability, stimulus generation can be scaled from the device level to the system level without modifying the lower level generator to implement more complex scenarios. In addition, stimulus can be generated for one transactor or for many transactors by a stage scenario generator. Further, each stage in a staged scenario generation method can add a new scenario decode callback as needed without any modification to the generator.

According to the present method, new generation stages can be continually added, with full reuse of the lower level generation stages. In order to reuse a test case from the device level to the system level, the scenario generation logic is used in the generator when the test case only has scenario type selection. This takes the test case logic from the device level to the system level with full reuse of the test case logic.

Figure 5A:
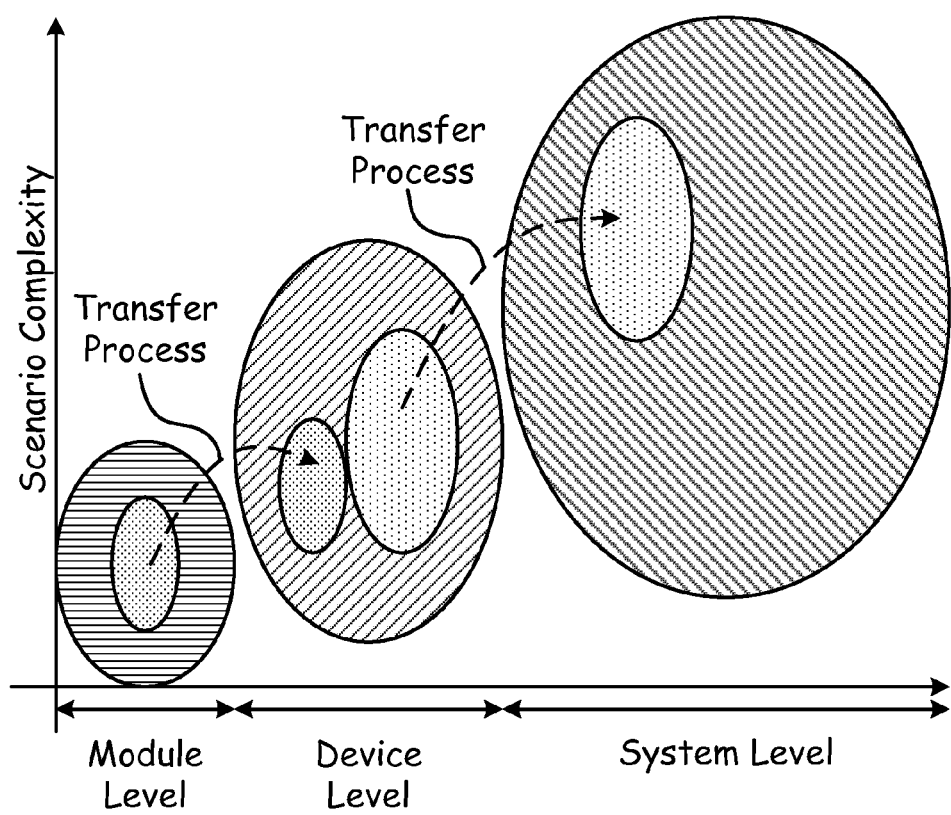
FIG. 5A is a graphical depiction of a prior art method for reusability between module level, device level, and system level verification as the scenario complexity increases.
Figure 5B:
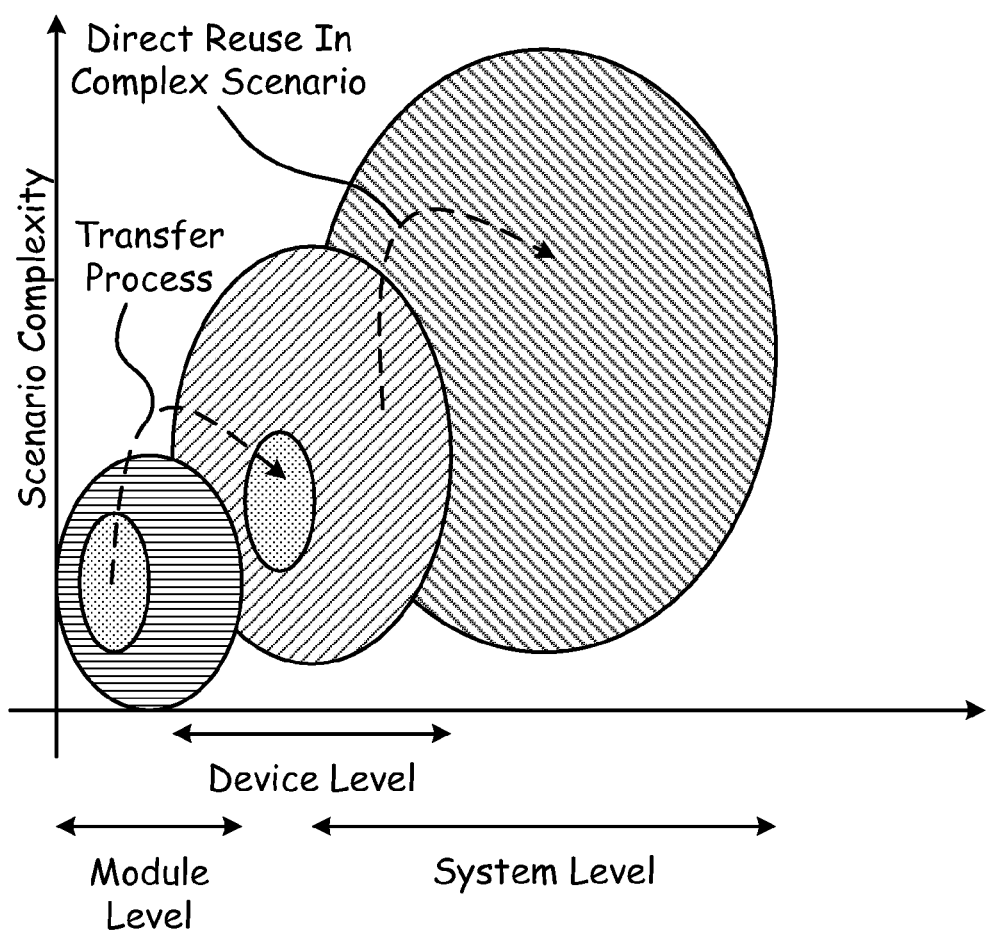
FIG. 5B is a graphical depiction of the reusability between module level, device level, and system level verification as the scenario complexity increases according to an embodiment of the present invention.

FIGS. 5A and 5B depict the test case reusability in terms of coding. In the known methods as depicted in FIG. 5A, porting the test case from a lower level to the next higher level needs some kind of transfer function. FIG. 5A shows the existing approach, in which the transfer function is as simple as including a portion of code from the lower level into the code for the higher level, or alternately manually recoding the higher level.

FIG. 5B shows the advantage of the present staged generation method, which simplifies test case development, reduces the number of transfer functions needed, and increases the reusability of the test cases from lower levels to higher levels. There is no test case code reuse in the prior art methods, and hence there is no overlap of test space as seen in the comparison of FIGS. 5A and 5B, whereas in the proposed methodology there is reuse of test code and there is overlap of test space.

The proposed staged scenario generation method is an extension to existing generation methodologies implemented in VMM/RVM. The first generator in this chain is typically an atomic transaction generator, the same as defined in the VMM/RVM method. Each stage generator is essentially an atomic generator with a randomized object of its own transaction class. However, after the stage scenario transaction is generated, it is decoded by the callback mechanism. The callback mechanism creates a sequence of lower stage scenario transactions that are injected into the lower stage generator. The randomized object in each stage can be replaced by a test case with its derived class instance and with additional constraints. Injection to a lower stage can be accomplished by sending a transaction to a channel. A higher stage generator injects into a channel disposed between the generators, and a lower stage generator receives it from the channel.

This method has been used for the verification of a NAND flash controller. Stage-0 was used to generate a sequence of the AHB transaction required to configure the NAND flash controller to initiate a command to the NAND flash memory for data storage or retrieval. Stage-1 was used to generate a scenario like to perform a page write→page read→block erase→page read operation. At system level, we have used a stage-2 generator that controls the stage0 generator, an to generate NAND commands to perform data transfer from the NAND Flash Memory to DDR, and vise versa, as required by the system level scenario. In other cases we have used Stage2 to control the Stage1 generator to check that the NAND controller is properly connected and accessible in a full chip system, by performing the Stage-1 scenario in a full chip setup. Callbacks are appended in the stage0 generator, which decodes the command type of the stage0 scenario transaction class, and returns a list of AHB transactions, which configures the NAND flash controller to initiate a command to the NAND flash memory. The device level test case is constrained only to select the command type. The stage2 generator generates the sequence of the stage0 scenario transaction with constraints on the command type, as required by the system/stage2 scenario type field in the stage2 scenario transaction. In this manner, all of the logic required for each scenario generation is embedded in the generator and not in the test case. Thus, the logic used at the lower levels of generation became reusable from the device level to the system level.

This staged scenario generation method described herein provides guidelines to implement controllable, reusable, and scalable stimulus generators by breaking down the generation process into different stages. The lowest stage of generation uses an atomic generator provided by HVL. Higher stages of generation are accomplished using a generator class that creates the next lower level scenario transactions and injects them into lower level generators. Constraint management and scenario controllability is achieved through a callback mechanism. Test case development thus becomes simpler, and is reduced to implementing callbacks and then calling them as needed. Thus, complex scenarios can easily be created by cascading different stages of generators, where the lowest level is nearer to the design ports and protocols and the highest level is nearer to the application. The cascading of stages can be achieved using HVL mechanisms like channels.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A processor-based method of verifying integrated circuit designs, the method comprising the steps of:
    constructing with the processor in a processor-accessible memory a series of atomic generators in a staged, hierarchical order,
    applying with the processor a lowest of the hierarchical generator stages to device level test cases of the verification process,
    applying with the processor a highest of the hierarchical generator stages to system level test cases of the verification process,
    reusing processor programming code written for and used in the lowest hierarchical generator stage in a next higher generator stage,
    creating with the processor a constraint scenario in the highest hierarchical generator stage, and
    injecting with the processor the constraint scenario into a next lower generator stage.

* * * * *